(12) United States Patent
Takahata et al.

(10) Patent No.: US 10,054,609 B2
(45) Date of Patent: Aug. 21, 2018

(54) SEMICONDUCTOR DEVICE AND METHOD FOR MANUFACTURING SAME

(71) Applicant: DENSO CORPORATION, Kariya, Aichi-pref. (JP)

(72) Inventors: Toshihiko Takahata, Kariya (JP); Eiichi Taketani, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/549,421

(22) PCT Filed: Feb. 1, 2016

(86) PCT No.: PCT/JP2016/000480
§ 371 (c)(1),
(2) Date: Aug. 8, 2017

(87) PCT Pub. No.: WO2016/129230
PCT Pub. Date: Aug. 18, 2016

(65) Prior Publication Data
US 2018/0024159 A1    Jan. 25, 2018

(30) Foreign Application Priority Data
Feb. 10, 2015 (JP) .................... 2015-024321

(51) Int. Cl.
  *H01L 23/48*  (2006.01)
  *G01P 15/08*  (2006.01)
  *H01L 29/84*  (2006.01)
  *H01L 23/02*  (2006.01)

(52) U.S. Cl.
  CPC .............. *G01P 15/08* (2013.01); *H01L 23/02* (2013.01); *H01L 29/84* (2013.01)

(58) Field of Classification Search
  CPC ......... H01L 2924/0105; H01L 2924/00; H01L 2924/01029; H01L 2924/0002; H01L 2924/0133; H01L 2224/05599; H01L 2224/29101; H01L 23/10;
  (Continued)

(56) References Cited

U.S. PATENT DOCUMENTS

2002/0180031 A1* 12/2002 Yamaguchi ........... B81B 7/0064
                                                                257/704
2010/0258950 A1* 10/2010 Li ........................ B81C 1/00269
                                                                257/777
2011/0000224 A1*  1/2011 Ghoshal ................. H01L 35/08
                                                                62/3.7

FOREIGN PATENT DOCUMENTS

JP    2000-243656 A    9/2000
JP    2013-050320 A    3/2013
JP    2013-055632 A    3/2013

* cited by examiner

*Primary Examiner* — Robert Bachner
(74) *Attorney, Agent, or Firm* — Posz Law Group, PLC

(57) ABSTRACT

A method for manufacturing a semiconductor device includes: preparing a first substrate; forming a metal film having a Ti layer as the most outermost surface on one surface of the first substrate a metal film having a Ti layer as the outermost surface; patterning the metal film to form a first pad portion; preparing a second substrate; forming on one surface of the second substrate a metal film having a Ti layer as the outermost surface; patterning the metal film to form a second pad portion; vacuum annealing the first substrate and the second substrate to remove an oxide film formed on the Ti layer in the first pad portion and the second pad portion; and bonding the first pad portion and the second pad portion together.

16 Claims, 6 Drawing Sheets

(58) Field of Classification Search
CPC ... H01L 2924/0001; H01L 2924/00014; H01L 2924/01047; H01L 2924/01
See application file for complete search history.

SEMICONDUCTOR DEVICE AND METHOD FOR MANUFACTURING SAME

CROSS REFERENCE TO RELATED APPLICATIONS

The present application is a U.S. national stage of International Patent Application No. PCT/JP2016/000480 filed on Feb. 1, 2016 and is based on Japanese Patent Application No. 2015-24231 filed on Feb. 10, 2015, the disclosures of which are incorporated herein by reference.

TECHNICAL FIELD

The present disclosure relates to a semiconductor device having a first substrate and a second substrate bonded together, and a sensing part disposed between the first substrate and the second substrate, and a method for manufacturing the semiconductor device.

BACKGROUND ART

Conventionally, semiconductor devices of this type with an acceleration sensing part have been proposed (see, for example, Patent Literature 1). More specifically, in this semiconductor device, a sensing part that detects acceleration is disposed between the first substrate and the second substrate. A first pad portion electrically connected to the sensing part is formed on the first substrate, and a second pad portion is formed on the second substrate in a portion opposite to the first pad portion. The first pad portion and the second pad portion are bonded together and electrically connected. The first pad portion and the second pad portion are formed of a material mainly composed of aluminum.

Since the first pad portion and the second pad portion are formed of a material mainly composed of aluminum in such a semiconductor device, the oxide film (natural oxide film) formed on the surface of the first pad portion and the second pad portion is very hard. When bonding the first pad portion and the second pad portion together, the oxide film formed on the first and second pad portions need to be removed before joining them so as to electrically connect the first and second pad portions. To remove the oxide film, the temperature has to be raised very high before or during the bonding of the first and second pad portions, or a very large load must be applied during the bonding. Subjecting the sensing part to such a state may possibly change its characteristics.

PRIOR ART LITERATURES

Patent Literature

Patent Literature 1: JP 2013-50320 A

SUMMARY OF INVENTION

It is an object of the present disclosure to provide a semiconductor device that can prevent characteristics of a sensing part from changing, and a method for manufacturing the semiconductor device.

According to a first aspect of the present disclosure, a semiconductor device has a first substrate having one surface, a second substrate having one surface and bonded to the first substrate such that the one surface of the second substrate faces the one surface of the first substrate, a sensing part arranged between the first substrate and the second substrate, a first pad portion arranged on the one surface of the first substrate and electrically connected to the sensing part, and a second pad portion arranged on the one surface of the second substrate and electrically connected to the first pad portion; and a method for manufacturing the semiconductor device includes: preparing the first substrate; forming the first pad portion on the one surface of the first substrate by forming a metal film including a Ti layer as an outermost surface and by patterning the metal film; preparing the second substrate; forming the second pad portion on the one surface of the second substrate by forming a metal film including a Ti layer as an outermost surface and by patterning the metal film; removing an oxide film formed on the Ti layer of the first pad portion and an oxide film formed on the Ti layer of the second pad portion by vacuum-annealing the first substrate and the second substrate; and bonding the first pad portion and the second pad portion together.

According to this aspect, the first and second pad portions are formed such that the Ti layers are the outermost surfaces. Therefore, by performing vacuum annealing, the oxide film formed on the surfaces of the Ti layers can readily be removed as compared to the oxide film on the surface of Al or the like, since oxygen in the oxide film easily penetrates into the Ti layers, and also the oxide film is fragile (easy to dissolve). Accordingly, the process of removing the oxide film is less likely to affect the sensing part, and possible changes in characteristics of the sensing part can be minimized.

According to a second aspect of the present disclosure, a semiconductor device includes: a first substrate that has one surface; a second substrate that has one surface and is bonded to the first substrate such that the one surface of the second substrate faces the one surface of the first substrate; a sensing part that is arranged between the first substrate and the second substrate; a first pad portion that is arranged on the one surface of the first substrate and is electrically connected to the sensing part; and a second pad portion that is arranged on the one surface of the second substrate and is electrically connected to the first pad portion. In addition, the first pad portion and the second pad portion respectively have a surface layer including Ti, and the surface layer including Ti of the first pad portion and the surface layer including Ti of the second pad portion are bonded together.

According to this aspect, the first and second pad portions are bonded together after the oxide film has been readily removed, since they are configured to have a surface layer containing Ti. Thus changes in the characteristics of the sensing part can be minimized in this semiconductor device.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Figure 1:
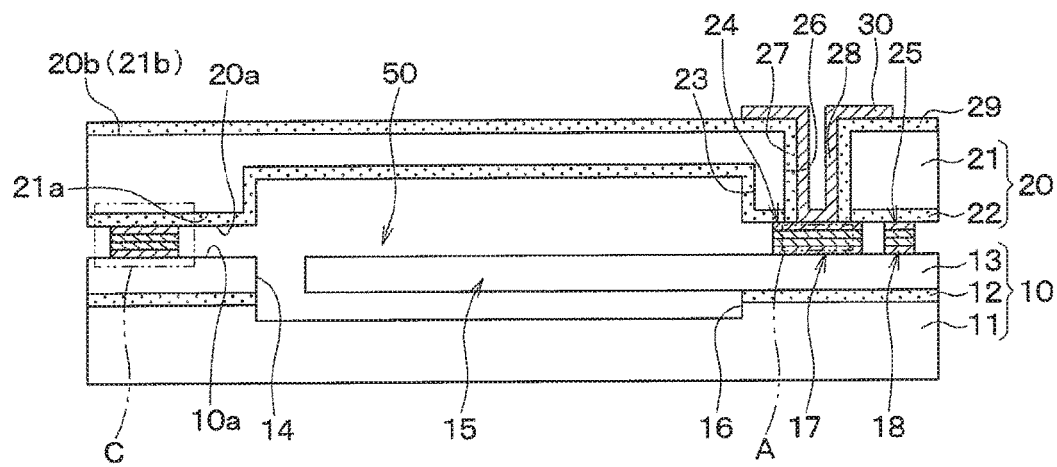
FIG. 1 is a cross-sectional view of a semiconductor device in a first embodiment of the present disclosure.

Embodiments of the present disclosure will be hereinafter described with reference to the drawings. Parts in various embodiments below that are identical or equivalent to each other are given the same reference numerals when described.

First Embodiment

A first embodiment of the present disclosure will be hereinafter described with reference to the drawings. As shown in FIG. 1, the semiconductor device of the present embodiment is configured by a first substrate 10 and a second substrate 20 stacked upon one another.

The first substrate 10 in the present embodiment is an SOI (Silicon on Insulator) substrate having a semiconductor layer 13 disposed on a support substrate 11 via an insulating film 12. One side 10a is configured by the surface of the semiconductor layer 13 on the opposite side from the insulating film 12. The support substrate 11 and the semiconductor layer 13 are formed of a silicon substrate or the like, while the insulating film 12 is formed of $SiO_2$, SiN, and the like.

A groove 14 is formed in the semiconductor layer 13 by a known micro-machining process, this groove 14 forming a sensing part 15. The sensing part 15 includes, but not limited to, a pressure sensor configured by a diffused resistor or the like, or an acceleration sensor or angular velocity sensor and the like configured by a beam structure provided in a compartment of the semiconductor layer 13.

In the present embodiment, a recess 16 is formed in the support substrate 11 and insulating film 12 in a portion opposite to the sensing part 15, so that the sensing part 15 is above the recess 16 and suspended in the air.

A first pad portion 17 and a first sealing portion 18 having a frame shape are formed on one side 10a of the first substrate 10 (surface of the semiconductor layer 13). More specifically, the first pad portion 17 is electrically connected to the sensing part 15. Although only one pad is shown in FIG. 1, in actuality, there are provided a plurality of pads in accordance with the purpose of use. The first sealing portion 18 is in a frame shape and surrounds the sensing part 15. The pad portion 17 is located inside a region surrounded by the first sealing portion 18.

Figure 2:
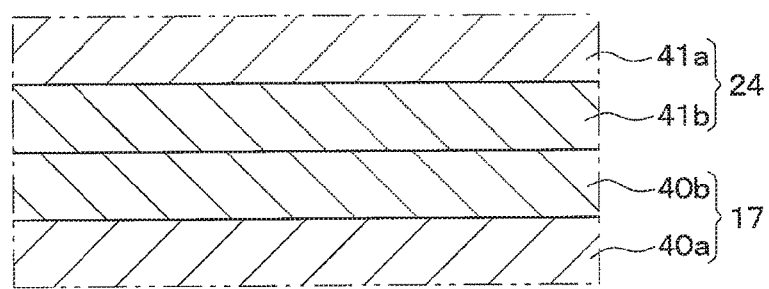
FIG. 2 is an enlarged view of region A in FIG. 1.

The first pad portion 17 of the present embodiment has a layered structure as shown in FIG. 2 wherein a Ti layer 40b is stacked on an Al layer 40a. Although not specifically shown, the first sealing portion 18 has a layered structure wherein a Ti layer 40b is stacked on an Al layer 40a, similarly to the first pad portion 17. The Al layer 40a in the present embodiment includes compounds such as Al—Cu, Al—Si—Cu, Al—Si, and the like, in addition to pure Al.

As shown in FIG. 1, the second substrate 20 includes a bonded substrate 21, and an insulating film 22 formed on one side 21a of the bonded substrate 21 facing the first substrate 10. One side 20a is formed by a surface of the insulating film 22 on the opposite side from the bonded substrate 21. The bonded substrate 21 is formed of a silicon substrate or the like, while the insulating film 22 is formed of $SiO_2$, SiN, and the like. The other side 20b of the second substrate 20 is formed by the other surface 21b of the bonded substrate 21 on the opposite side from the one side 21a.

A recess 23 is formed in one side 21a of the bonded substrate 21 in a portion opposite to the sensing part 15. While the insulating film 22 is formed also on the walls of the recess 23 in the present embodiment, the insulating film 22 need not necessarily be formed on the walls of the recess 23.

On one side 20a of the second substrate 20, a second pad portion 24 is formed in a portion opposite to the first pad portion 17, as well as a second sealing portion 25 having a (frame-like) shape conforming to that of the first sealing portion 18 in a portion opposite to the first sealing portion 18.

As shown in FIG. 2, the second pad portion 24 has a layered structure wherein a Ti layer 41b is stacked on an Al layer 41a. Although not specifically shown, the second sealing portion 25 has a layered structure wherein a Ti layer 41b is stacked on an Al layer 41a, similarly to the second pad portion 17. The Al layer 41a in the present embodiment includes compounds such as Al—Cu, Al—Si—Cu, Al—Si, and the like, in addition to pure Al, similarly to the Al layer 40a mentioned above.

Furthermore, a through hole 26 is formed in the second substrate 20 so as to extend through the second substrate 20 in a stacking direction of the first and second substrates 10 and 20 as far as to the second pad portion 24, and a through-hole electrode 28 is formed in this through hole 26 via an insulating film 27. An insulating film 29 is formed on the other side 20b of the second substrate 20 (other surface 21b of the bonded substrate 21), and a terminal portion 30 that is electrically connected to the through-hole electrode 28 and to an external circuit via a bonding wire (not shown) is formed on the insulating film 29. In the present embodiment, the through-hole electrode 28 and terminal portion 30 are formed of Al, while the insulating film 29 is formed of TEOS.

The second substrate 20 configured as described above is bonded and united with the first substrate 10. More specifically, the first substrate 10 and the second substrate 20 are united by metal bonding between the first pad portion 17 and the second pad portion 24, and between the first sealing portion 18 and the second sealing portion 25. In more detailed terms, the Ti layer 40b of the first pad portion 17 and the Ti layer 41b of the second pad portion 24 are joined by metal bonding, and the Ti layer 40b of the first sealing portion 18 and the Ti layer 41b of the second sealing portion 25 are joined by metal bonding. The space surrounded by the first and second substrates 10 and 20, and the first and second sealing portions 18 and 25 forms an airtight cavity 50, with the sensing part 15 being encapsulated in this airtight cavity 50. In the present embodiment, a vacuum is drawn in the airtight cavity.

The semiconductor device of the present embodiment is configured as described above. Next, a method for manufacturing the semiconductor device will be described.

Figure 3A:
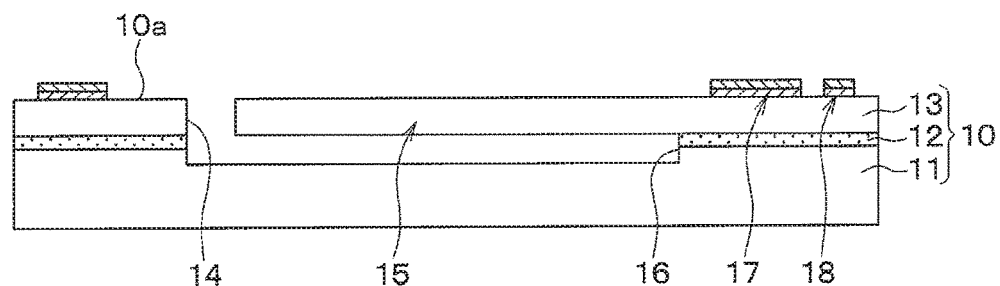
FIG. 3A to FIG. 3C are cross-sectional views showing a method for manufacturing the semiconductor device shown in FIG. 1.

First, as shown in FIG. 3A, the first substrate 10 provided with the sensing part 15, first pad portion 17, and first sealing portion 18 is prepared. To make the first substrate 10, the support substrate 11 is prepared first, for example, and the insulating film 12 is formed on the support substrate 11 by a CVD (Chemical Vapor Deposition) method or thermal oxidation. The recess 16 described above is formed next by wet etching or the like, after which the insulating film 12 and the semiconductor layer 13 are bonded together, whereby the first substrate 10 is formed. The insulating film 12 and the semiconductor layer 13 may be bonded by a method known as direct bonding, wherein an Ar ion beam is projected to a bonding surface to activate the bonding surface prior to the bonding, but the method is not specifically limited to this.

After that, a metal film is formed by a CVD method or the like on one side 10a of the first substrate 10, and this metal film is patterned by reactive ion etching or the like to form the first pad portion 17 and the first sealing portion 18. The first pad portion 17 and the first sealing portion 18 of the present embodiment have a laminated structure as mentioned above wherein the Ti layer 40b is stacked on the Al layer 40a. Therefore, the first pad portion 17 and the first sealing portion 18 are formed by depositing the Ti layer 40b after the Al layer 40a has been formed so as to obtain a metal film with the Ti layer 40b being the outermost surface, and by patterning this metal film. After that, the semiconductor layer 13 is etched by reactive ion etching or the like to form the groove 14, to provide the sensing part 15. Thus the first substrate 10 provided with the sensing part 15, the first pad portion 17, and the first sealing portion 18 is prepared.

Figure 3B:
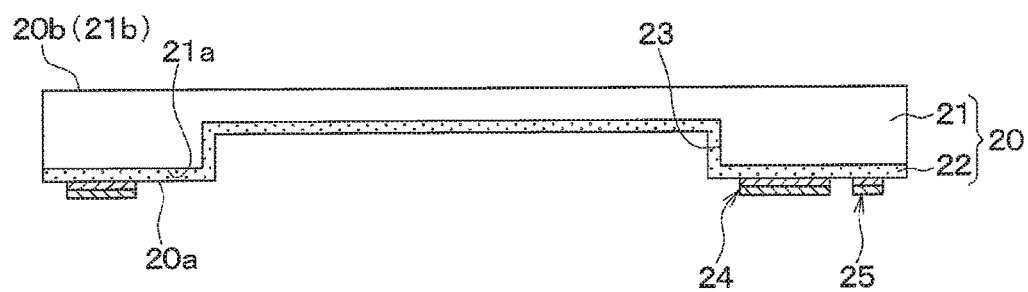

Next, the second substrate 20 provided with the second pad portion 24 and second sealing portion 25 is prepared as shown in FIG. 3B, in a different process from the one shown in FIG. 3A. To make this second substrate 20, first, the bonded substrate 21 is prepared, for example, and the recess 23 is formed by dry etching or the like in one side 21a of the bonded substrate 21. Next, the insulating film 22 is formed by a CVD method or thermal oxidation on one side 20a of the bonded substrate 21. After that, a metal film is formed by a CVD method or the like, and this metal film is patterned by reactive ion etching or the like to form the second pad portion 24 and second sealing portion 25. As mentioned above, the second pad portion 24 and the second sealing portion 25 of the present embodiment have a laminated structure wherein the Ti layer 41b is stacked on the Al layer 41a. Therefore, the second pad portion 24 and the second sealing portion 25 are formed by depositing the Ti layer 41b after the Al layer 41a has been formed so as to obtain a metal film with the Ti layer 41b being the outermost surface, and by patterning this metal film.

In the processes shown in FIG. 3A and FIG. 3B, when laminating the Ti layers 40b and 41b on the Al layers 40a and 41a, it is preferable to form the Ti layers 40b and 41b after the formation of the Al layers 40a and 41a without exposing them to the atmosphere, so that no oxide film is formed on the surfaces of the Al layers 40a and 41a.

Figure 3C:
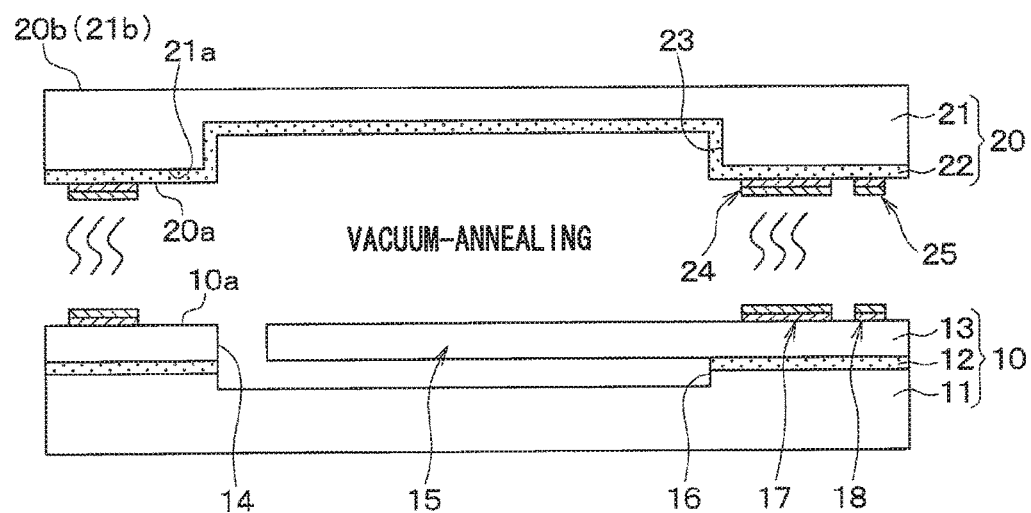

After that, as shown in FIG. 3C, the first substrate 10 and the second substrate 20 are subjected to heat treatment at a temperature of 180 degrees Celsius or more under vacuum (vacuum annealing), so as to remove the oxide film (natural oxide film) formed on the surfaces of the Ti layers 40b and 41b. As compared to the oxide film formed on the surface of an Al layer, the oxide film formed on the surfaces of the Ti layers 40b and 41b can readily be removed by vacuum annealing, since oxygen in the oxide film easily penetrates into the Ti layers 40b and 41b, and also the oxide film is fragile (easy to dissolve). The heat treatment may be carried out at a temperature of 400 degrees Celsius or more depending on the structure of the sensing part 15.

Figure 4A:
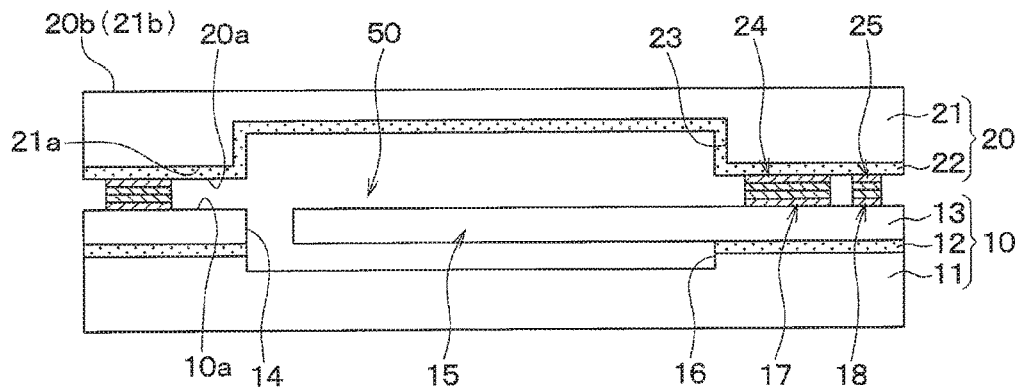
FIG. 4A to FIG. 4C are cross-sectional views showing a method for manufacturing the semiconductor device continuing from FIG. 3.

After that, the first substrate 10 and second substrate 20 are bonded together, as shown in FIG. 4A. More specifically, the substrates are aligned with each other with the use of an infrared microscope or the like based on alignment marks that have been formed as required, and solid-state metal bonding is carried out to join the first pad portion 17 of the first substrate 10 and the first pad portion 24 of the second substrate 20, and to join the first sealing portion 18 of the first substrate 10 and the second sealing portion 25 of the second substrate 20. In more detailed terms, the Ti layers 40b and 41b of the first and second pad portions 17 and 24 are joined by metal bonding, and the Ti layers 40b and 41b of the first and second sealing portions 18 and 25 are joined by metal bonding. Thereby, the airtight cavity 50 is formed between the first substrate 10 and the second substrate 20, and the sensing part 15 is encapsulated in the airtight cavity 50.

In this process, since the oxide film formed on the surfaces of the Ti layers 40b and 41b has already been removed in the process of FIG. 3C, no large load needs to be applied to the first and second substrates 10 and 20 during the bonding.

Figure 4B:
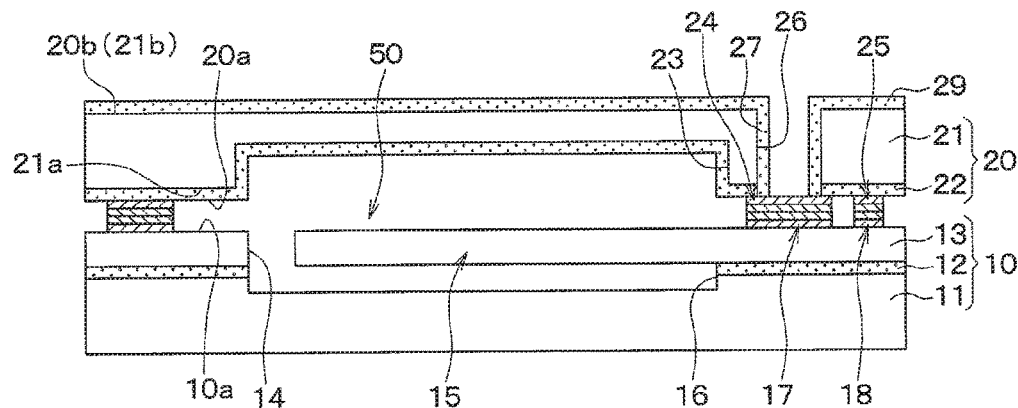

Successively, as shown in FIG. 4B, the through hole 26 is formed so as to extend through the second substrate 20 in the stacking direction of the first and second substrates 10 and 20 as far as to reach the second pad portion 24. An insulating film 27 such as TEOS is formed on the wall surface of this through hole 26. At this time, the insulating film formed on the other side 20b of the second substrate 20 (other surface 21b of the bonded substrate 21) also configures the insulating film 29. In other words, the insulating film 27 and the insulating film 29 are formed in the same process. After that, the insulating film 27 formed on the bottom of the through hole 26 is removed, so that the second pad portion 24 is exposed within the through hole 26.

Figure 4C:
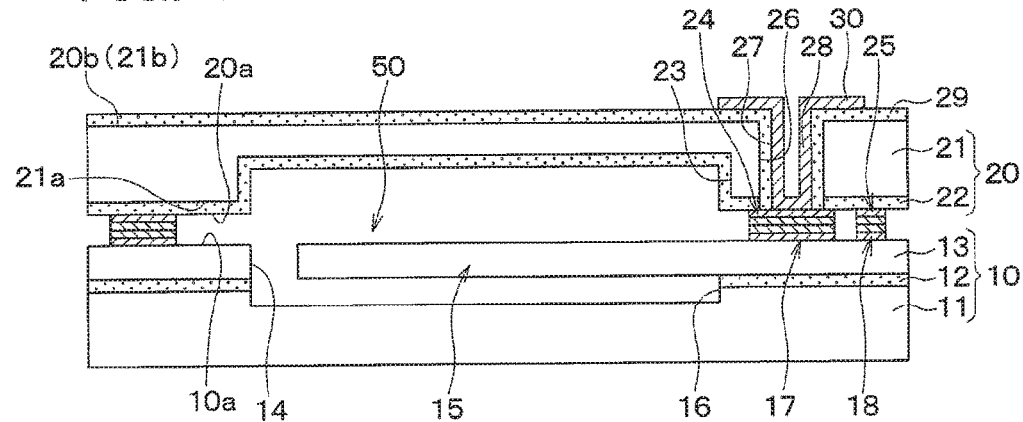

Next, as shown in FIG. 4C, a metal film is deposited in the through hole 26 by a sputtering or deposition method and the like to form the through-hole electrode 28, and the metal film on the insulating film 29 is patterned so as to form the terminal portion 30. The semiconductor device of the present embodiment is thus manufactured.

While the method for manufacturing one semiconductor device has been described above, the first and second substrates 10 and 20 may be prepared in a wafer form, and after bonding them together, they may be divided into chip units by dicing.

As described above, in the present embodiment, the first pad portion 17 and first sealing portion 18 are formed by stacking the Ti layer 41b on the Al layer 40a, and the second pad portion 24 and second sealing portion 25 are formed by stacking the Ti layer 41b on the Al layer 41a. By performing vacuum annealing before bonding the first pad portion 17 and the second pad portion 24, and the first sealing portion 18 and the second sealing portion 25, the oxide film formed on the surfaces of the Ti layers 40b and 41b can be removed easily as compared to the oxide film formed on the surface of Al or the like, since oxygen in the oxide film easily penetrates into the Ti layers 40b and 41b, and also the oxide film is fragile (easy to dissolve). Accordingly, the step of removing the oxide film is less likely to affect the sensing part 15, and possible changes in characteristics of the sensing part 15 can be minimized.

While the Ti layers 40b and 41b are formed on the surfaces of the first and second pad portions 17 and 24 and of the first and second sealing portions 18 and 25, the terminal portion 30 is formed of Al as conventionally.

Therefore, the wire bonding for connecting an external circuit and the terminal portion 30 can be performed as conventionally practiced.

Although it is possible to use Au to form the first and second pad portions 17 and 24 and the first and second sealing portions 18 and 25 so as to make the first and second pad portions 17 and 24 and the first and second sealing portions 18 and 25 hard to oxidize, the use of Ti layers 40b and 41b as in the present embodiment to make the oxide film easier to remove can minimize a cost increase.

In the present embodiment, when joining the first and second substrates 10 and 20, the first and second pad portions 17 and 24 and the first and second sealing portions 18 and 25 are bonded together in solid state. As compared to liquid-state bonding of the first and second pad portions 17 and 24 and the first and second sealing portions 18 and 25, the possibility of the spacing control between one side 10a of the first substrate 10 and one side 20a of the second substrate 20 becoming complex can be avoided.

While one example has been described above wherein Ti layers 40b and 41b are formed on Al layers 40a and 41a, the metal layers that is formed under the Ti layers 40b and 41b can be changed as required.

Second Embodiment

A second embodiment of the present disclosure will now be described. In the present embodiment, as compared to the first embodiment, a gettering layer is formed in the airtight cavity 50. Other features are the same as those of the first embodiment and will not be described again here.

Figure 5:
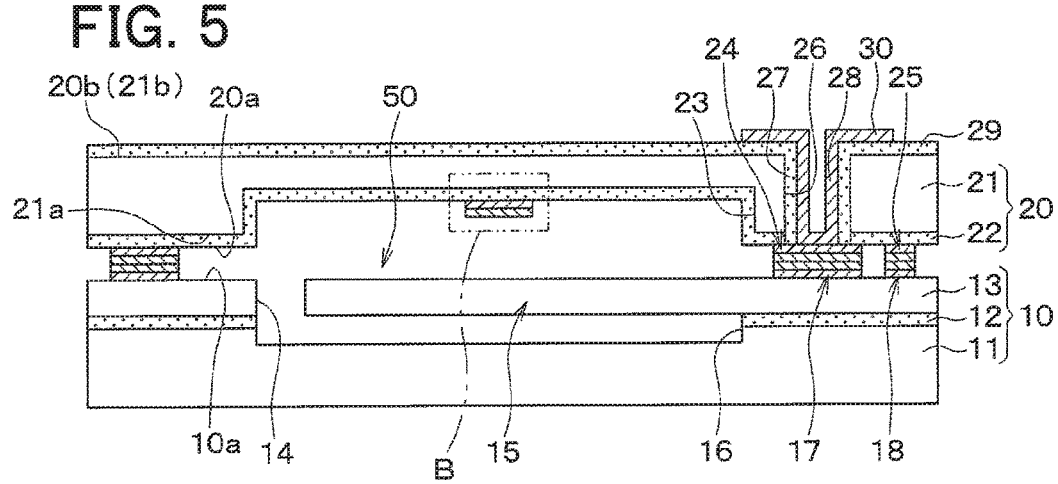
FIG. 5 is a cross-sectional view of a semiconductor device in a second embodiment of the present disclosure.
Figure 6:
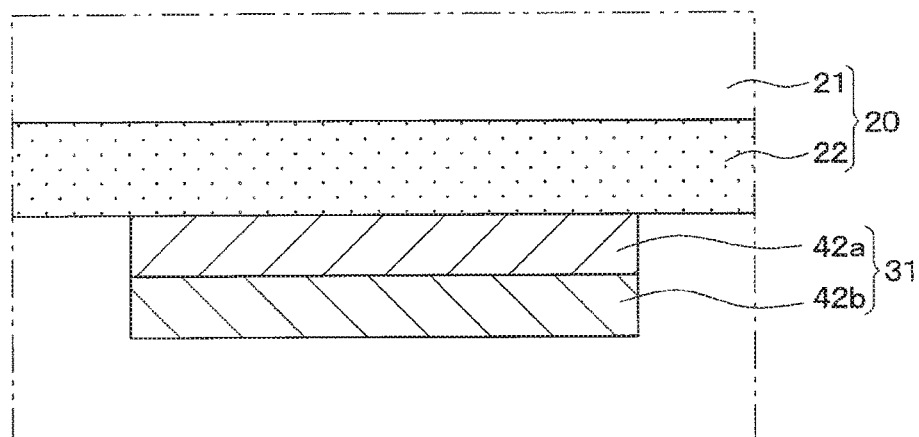
FIG. 6 is an enlarged view of region B in FIG. 5.

In the present embodiment, as shown in FIG. 5, a gettering layer 31 that adsorbs active gasses is formed on the insulating film 22 on the bottom surface of the recess 23. Similarly to the second pad portion 24 and the second sealing portion 25, the gettering layer 31 has a layered structure as shown in FIG. 6 wherein a Ti layer 42b is stacked on an Al layer 42a.

Such a semiconductor device is manufactured by preparing a second substrate 20 that has the gettering layer 31 in the process of FIG. 3B. More specifically, in the present embodiment, since the gettering layer 31 is configured similarly to the second pad portion 24 and the second sealing portion 25, the gettering layer 31 is formed in the same process as that for forming the second pad portion 24 and the second sealing portion 25. In other words, it is formed at the same time when forming the second pad portion 24 and the second sealing portion 25 by patterning, which is performed after forming the metal film in the process of FIG. 3B. That is, the Al layer 41a and the Ti layer 41b of the second pad portion 24 and the second sealing portion 25 and the Al layer 42a and the Ti layer 42b of the gettering layer 31 are formed in the same process.

This way, the degree of vacuum in the airtight cavity 50 can be maintained thanks to the gettering layer 31 formed inside the airtight cavity 50.

Third Embodiment

A third embodiment of the present disclosure will now be described. In the present embodiment, as compared to the second embodiment, the structure of the gettering layer 31 is changed. Other features are the same as those of the second embodiment and will not be described again here.

Figure 7:
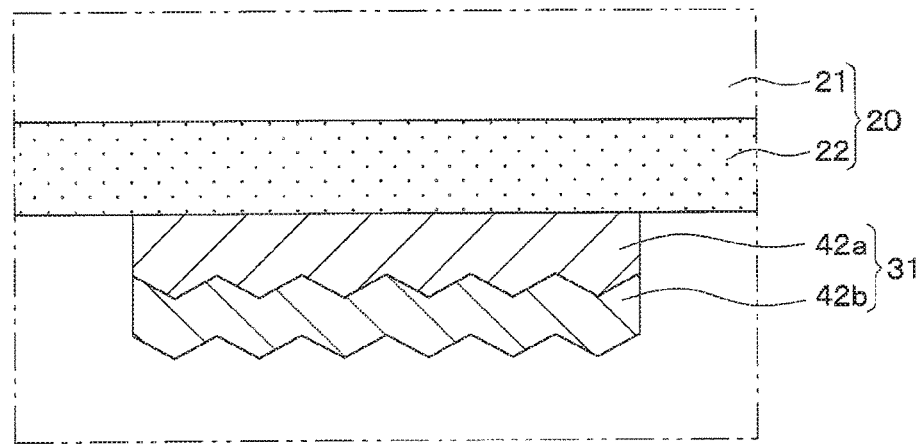
FIG. 7 is a partially enlarged view of a semiconductor device in a third embodiment of the present disclosure.

In the present embodiment, as shown in FIG. 7, the Al layer 42a has surface irregularities provided by roughening treatment. The Ti layer 42b is formed on the surface-roughened Al layer 42a. FIG. 7 is an enlarged view of a portion corresponding to region B in FIG. 5. In the present embodiment, the Al layer 42a corresponds to a foundation layer of the present disclosure.

Such a semiconductor device is made by forming the Ti layer 42b (Ti layer 41b) after the roughening treatment such as bias sputtering or blasting to the part that forms the gettering layer 31 (foundation layer in the present disclosure), following the formation of the Al layer 42a (Al layer 41a), in the process of FIG. 3B.

Thereby, the surface area of the Ti layer 42b that functions as a getter material can be increased, so that the area that exhibits the adsorption (gettering) effect can be increased. Thus, the degree of vacuum in the airtight cavity 50 can be maintained.

Fourth Embodiment

A fourth embodiment of the present disclosure will now be described. In the present embodiment, as compared to the second embodiment, the structure of the gettering layer 31 is changed. Other features are the same as those of the second embodiment and will not be described again here.

Figure 8:
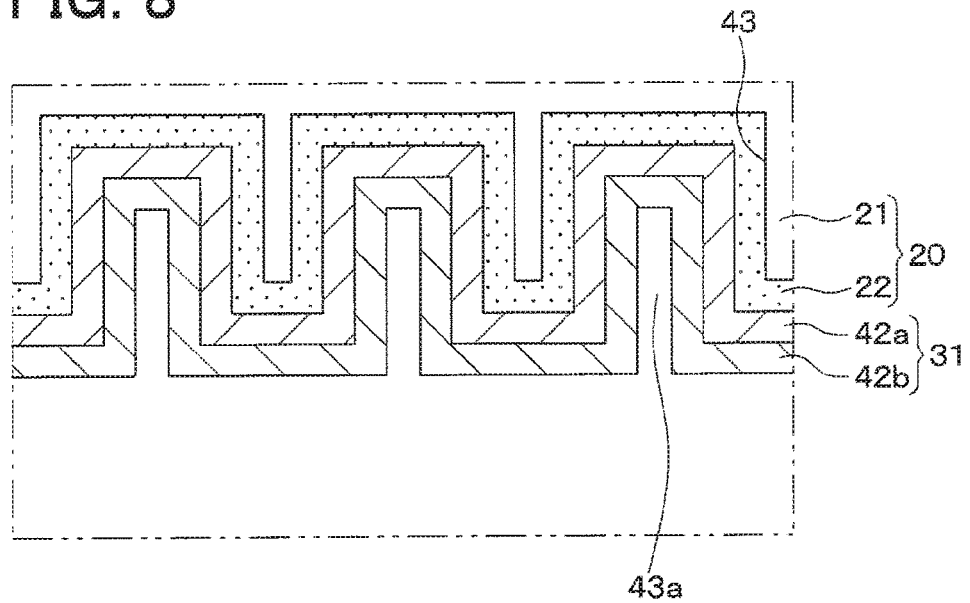
FIG. 8 is a partially enlarged view of a semiconductor device in a fourth embodiment of the present disclosure.

In the present embodiment, as shown in FIG. 8, a plurality of trenches 43 are formed on the bottom surface of the recess 23. The insulating film 22 is formed also on the wall surfaces of the trenches 43. FIG. 8 is an enlarged view of a portion corresponding to region B in FIG. 5, i.e., an enlarged view of the vicinity of the bottom surface of the recess 23. The distance between the side faces of the trench 43 facing each other from the open side to the bottom surface side (width of the trench 43) is substantially constant in the present embodiment. The gettering layer 31 is formed along the wall surfaces of the trenches 43 such that there remains spaces 43a inside the trenches 43. That is, the gettering layer 31 is formed so as not to bury the trenches 43.

Such a semiconductor device is manufactured by forming the trenches 43 after providing the recess 23 in the process of FIG. 3B.

Thereby, similarly to the third embodiment described above, the surface area of the Ti layer 42b that functions as a getter material can be increased, which further helps maintain the degree of vacuum in the airtight cavity 50.

In the present embodiment, the trenches 43 may be formed such that the distance between the opposing side faces is gradually reduced to be tapered from the open side toward the bottom side.

Fifth Embodiment

A fifth embodiment of the present disclosure will now be described. In the present embodiment, as compared to the first embodiment, the structures of the first and second pad portions 17 and 24 and first and second sealing portions 18 and 25 are changed. Other features are the same as those of the first embodiment and will not be described again here.

Figure 9:
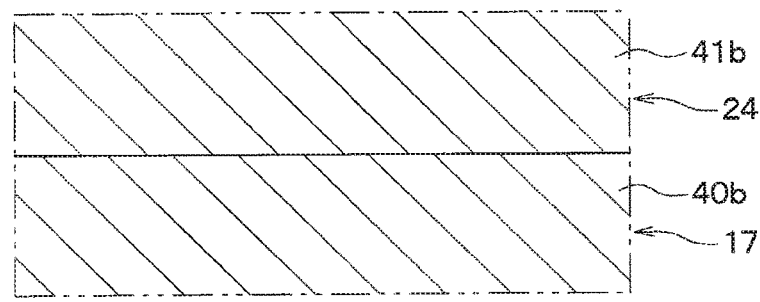
FIG. 9 is a partially enlarged view of a semiconductor device in a fifth embodiment of the present disclosure.

In the present embodiment, as shown in FIG. 9, the first and second pad portions 17 and 24 are formed only of the Ti layers 40b and 41b and no Al layers 40a and 41a are provided. Similarly, although not specifically shown, the first and second sealing portions 18 and 25 are made only of the Ti layers 40b and 41b and no Al layers 40a and 41a are provided. FIG. 9 is an enlarged view of a portion corresponding to region A in FIG. 1.

Such a semiconductor device is configured by stacking the Ti layers 40b and 41b only in the processes of FIG. 3A and FIG. 3B.

Thereby, since the first pad portion 17 and the second pad portion 24 and the first sealing portions 18 and the second sealing portion 25 are formed only of the Ti layers 40b and 41b, no voids will be formed, which can result from diffusion of Al into the Ti layers 40b and 41b, when bonding the first pad portion 17 and the second pad portion 24 together, and bonding the first sealing portion 18 and the second sealing portion 25 together. Thus, the bonding strength is prevented from being reduced.

In the present embodiment, one example has been described wherein the first and second pad portions 17 and 24 and the first and second sealing portions 18 and 25 are formed only of the Ti layers 40b and 41b. Alternatively, if the Al layers 40a and 41a are to be provided, a TiW layer may be disposed on the Al layers 40a and 41a so as to minimize diffusion of Al.

Sixth Embodiment

A sixth embodiment of the present disclosure will now be described. In the present embodiment, a spacer is provided as compared to the first embodiment. Other features are the same as those of the first embodiment and will not be described again here.

Figure 10:
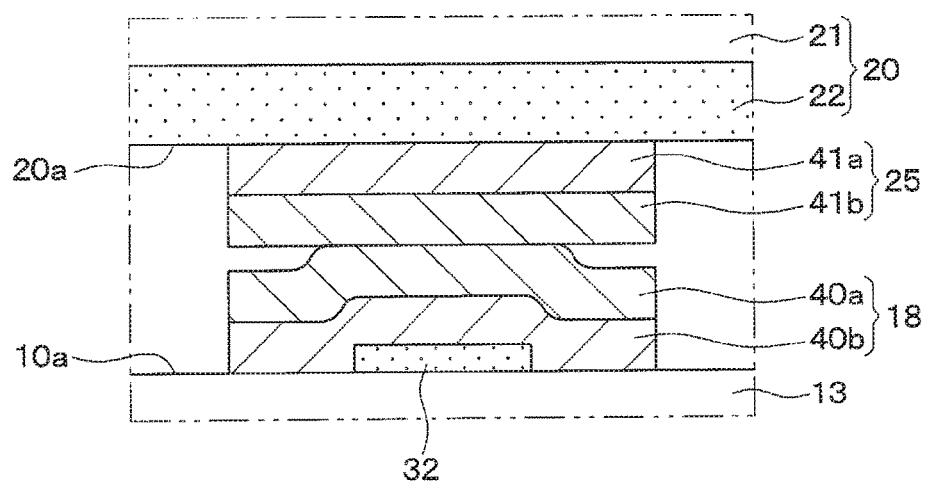
FIG. 10 is a partially enlarged view of a semiconductor device in a sixth embodiment of the present disclosure.

In the present embodiment, as shown in FIG. 10, a spacer 32 is disposed on one side 10a of the first substrate 10 such that it is covered by the first sealing portion 18. Although not specifically shown, a spacer 32 is disposed on one side 10a of the first substrate 10 such that it is covered by the first pad portion 17. FIG. 10 is an enlarged view of a portion corresponding to region C in FIG. 1. The spacer 32 is made of an insulating film such as an oxide film for example, and the spacer 32 encapsulated in the first sealing portion 18 has a frame-like structure corresponding to the shape of the first sealing portion 18.

Such a semiconductor device is manufactured by forming the spacers 32 in the process of FIG. 3A before the formation of the first pad portion 17 and first sealing portion 18, and by forming the first pad portion 17 and the first sealing portion 18 so as to cover the spacers 32.

Thereby, the degree of freedom in manufacturing conditions during the bonding can be improved, as the spacers 32 enable the spacing between one side 10a of the first substrate 10 and one side 20a of the second substrate 20 to be kept equal to or larger than the height of the spacers 32. The height of the spacers 32 here refers to the length of the spacers 32 in the direction normal to one side 10a of the first substrate 10.

Seventh Embodiment

A seventh embodiment of the present disclosure will now be described. In the present embodiment, as compared to the first embodiment, the sizes of the first and second pad portions 17 and 24 and first and second sealing portions 18 and 25 are changed. Other features are the same as those of the first embodiment and will not be described again here.

Figure 11:
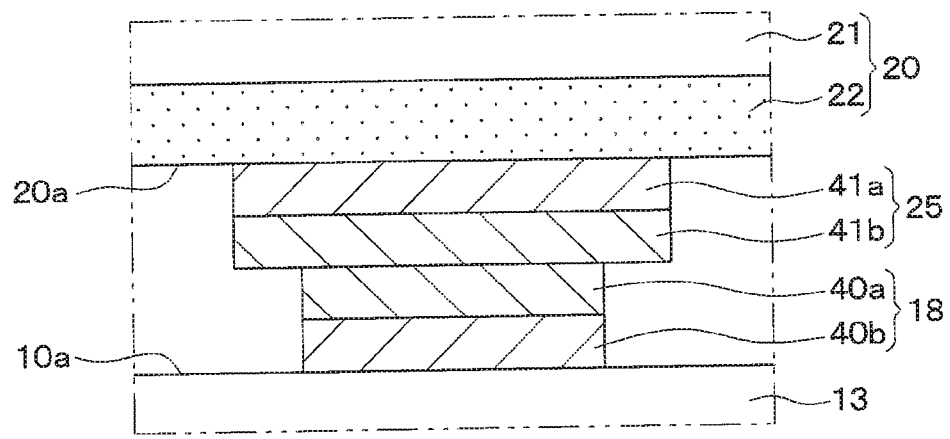
FIG. 11 is a partially enlarged view of a semiconductor device in a seventh embodiment of the present disclosure.

In the present embodiment, as shown in FIG. 11, the size of the second sealing portion 25 is larger than that of the first sealing portion 18. Although not specifically shown, the size of the second pad portion 24 is larger than that of the first pad portion 17. The size here refers to the size of a planar shape as viewed from a normal direction to one side 10a or 20a of the first or second substrate 10 or 20.

Such a semiconductor device can be manufactured by changing the shapes of the first and second pad portions 17 and 24 and the first and second sealing portions 18 and 25 as required when forming them by patterning in the processes of FIG. 3A and FIG. 3B.

Thereby, the robustness against misalignment when bonding together the first and second pad portions 17 and 24, and the first and second sealing portions 18 and 25 is improved, since the first pad portion 17 and second pad portion 24 have a size different from that of the first sealing portion 18 and second sealing portion 25.

Eighth Embodiment

An eighth embodiment of the present disclosure will now be described. In the present embodiment, the airtight cavity 50 has a nitrogen atmosphere therein as compared to the first embodiment. Other features are the same as those of the first embodiment and will not be described again here.

Figure 12:
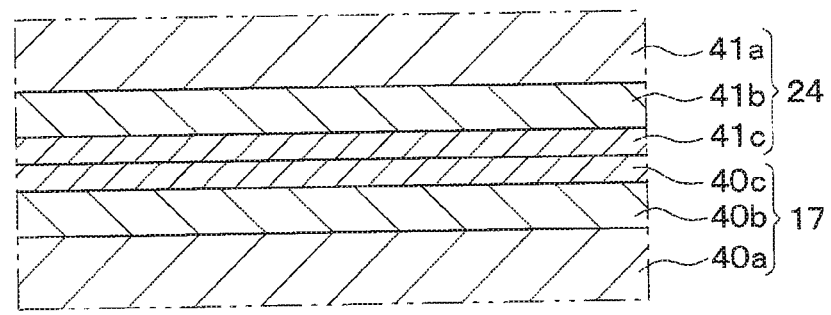
FIG. 12 is a partially enlarged view of a semiconductor device in an eighth embodiment of the present disclosure.

The basic structure of the present embodiment is the same as that of the first embodiment, except that the airtight cavity 50 has a nitrogen atmosphere therein. TiN layers 40c and 41c are formed on the surfaces of the first pad portion 17 and second pad portion 24 as shown in FIG. 12, and these TiN layers 40c and 41c are bonded together.

Although not specifically shown, TiN layers 40c and 41c are formed on the surfaces of the first and second sealing portions 18 and 25 similarly to the first and second pad portions 17 and 24, and these TiN layers 40c and 41c are bonded together. FIG. 12 is an enlarged view of region A in FIG. 1. Since the TiN layers 40c and 41c are conductive, an electrical connection is established between the first pad portion 17 and the second pad portion 24 by bonding the TiN layers 40c and 41c together.

To manufacture such a semiconductor device, after performing the process of FIG. 3C, the first and second substrates 10 and 20 are placed under a $N_2$ atmosphere. During this process, the TiN layers 40c and 41c are formed on the surfaces of the Ti layers 40b and 41b, respectively. By joining the TiN layers 40c and 41c by metal bonding, the semiconductor device of the present embodiment is manufactured.

This way, the present disclosure can also be applied to a semiconductor device having the airtight cavity 50 filled with nitrogen. With the airtight cavity 50 that is filled with nitrogen, TiN layers 40c and 41c are formed on the surfaces of the Ti layers 40b and 41b. As compared to removing the TiN layers 40c and 41c, the manufacturing process could be made simpler by bonding the TiN layers 40c and 41c together, because the TiN layers 40c and 41c are conductive.

Other Embodiments

The present disclosure is not limited to the embodiments described above, and can be changed as required within the technical scope of the present disclosure.

For example, in the first embodiment, the first substrate 10 may be made of crystal instead of SOI.

In the first, fifth, sixth, and seventh embodiments, the airtight cavity 50 may not be formed.

In the second to fourth embodiments, the gettering layer 31 may be formed to the first substrate 10.

While one example has been described wherein spacers 32 are disposed so as to be covered by the first pad portion 17 and the first sealing portion 18 in the sixth embodiment, the spacers 32 need not necessarily be covered by the first pad portion 17 and the first sealing portion 18. The spacer 32 may be formed outside the first sealing portion 18 so as to surround the first sealing portion 18. The spacer 32 may be formed to the second substrate 20. In other words, the location for forming the spacers 32 can be changed as required, as long as the spacing between one side 10*a* of the first substrate 10 and one side 20*a* of the second substrate 20 is defined to be equal to or larger than the height of the spacers 32.

Further, the various embodiments described above can be combined. For example, the second to fourth embodiments may be combined with one of the fifth to eighth embodiments so as to include the gettering layer 31. The fifth embodiment may be combined with one of the sixth to eighth embodiments, so that the first and second pad portions 17 and 24 and the first and second sealing portions 18 and 25 are formed only by the Ti layers 40*b* and 41*b*. The sixth embodiment may be combined with the seventh or eighth embodiment so as to include the spacer 32. The seventh embodiment may be combined with the eighth embodiment so that the first pad portion 17 and the second pad portion 24, and the first sealing portion 18 and the second sealing portion 25 have planar shapes with different sizes. Further, these embodiments combined as described above can further be combined with others as required.

While the present disclosure has been described with reference to embodiments thereof, it is to be understood that the disclosure is not limited to the embodiments and constructions. The present disclosure is intended to cover various modification and equivalent arrangements. While the various combinations and configurations, other combinations and configurations, including more, less or only a single element, are also within the spirit and scope of the present disclosure.

The invention claimed is:

1. A method for manufacturing a semiconductor device including
   a first substrate having one surface,
   a second substrate having one surface and bonded to the first substrate such that the one surface of the second substrate faces the one surface of the first substrate,
   a sensing part arranged between the first substrate and the second substrate,
   a first pad portion arranged on the one surface of the first substrate and electrically connected to the sensing part, and
   a second pad portion arranged on the one surface of the second substrate and electrically connected to the first pad portion, the method comprising:
   preparing the first substrate;
   forming the first pad portion on the one surface of the first substrate by forming a metal film including a Ti layer as an outermost surface and by patterning the metal film;
   preparing the second substrate;
   forming the second pad portion on the one surface of the second substrate by forming a metal film including a Ti layer as an outermost surface and by patterning the metal film;
   removing an oxide film formed on the Ti layer of the first pad portion and an oxide film formed on the Ti layer of the second pad portion by vacuum-annealing the first substrate and the second substrate; and
   bonding the first pad portion and the second pad portion together.

2. The method for manufacturing a semiconductor device according to claim 1, wherein:
   in the forming of the first pad portion, a first sealing portion in a frame shape surrounding the first pad portion is formed with the first pad portion by patterning the metal film formed on the one surface of the first substrate;
   in the forming of the second pad portion, a second sealing portion surrounding the second pad and having a shape, which corresponds to the frame shape of the first sealing portion, is formed with the second pad portion by patterning the metal film formed on the one surface of the second substrate;
   in the removing of the oxide film, an oxide film formed on the Ti layer of the first sealing portion and an oxide film formed on the Ti layer of the second sealing portion are removed together with the oxide film formed on the Ti layer of the first pad portion and the oxide film formed on the Ti layer of the second pad portion; and
   in the bonding of the first pad portion and the second pad portion together, an airtight cavity is formed between the first substrate and the second substrate by bonding the first pad portion and the second pad portion together, and by bonding the first sealing portion and the second sealing portion together so that the sensing part is encapsulated in the airtight cavity.

3. The method for manufacturing a semiconductor device according to claim 2, further comprising:
   forming a gettering layer, which adsorbs active gas in a portion to be arranged inside the airtight cavity of at least one of the first substrate and the second substrate before the removing of the oxide film.

4. The method for manufacturing a semiconductor device according to claim 3,
   wherein, in the forming of the gettering layer, a foundation layer is formed, the foundation layer is roughened, and a Ti layer is formed on the roughened foundation layer.

5. The method for manufacturing a semiconductor device according to claim 3, further comprising:
   forming a trench in a portion where the gettering layer is to be formed prior to forming the gettering layer,
   wherein, in the forming of the gettering layer, the gettering layer is formed along a wall surface of the trench so as to have a space inside the trench.

6. The method for manufacturing a semiconductor device according to claim 2,
   wherein, in each of the forming of the first pad portion, the forming of the second pad portion, the forming of the first sealing portion, and the forming of the second sealing portion, only the Ti layer is formed as the metal film.

7. The method for manufacturing a semiconductor device according to claim 2, wherein:
   in the forming of the first pad portion and in the forming of the second pad portion, different sizes are set for planar shapes of the first pad portion and the second pad portion respectively; and,
   in the forming of the first sealing portion and in the forming of the second sealing portion, different sizes are set for planar shapes of the first sealing portion and the second sealing portion respectively.

8. The method for manufacturing a semiconductor device according to claim 2, the method further comprising:
   forming a TiN layer to bonding surfaces between the first pad portion and the second pad portion, and between the first sealing portion and the second sealing portion by placing the first substrate and the second substrate under a nitrogen atmosphere after the oxide film is removed, wherein, in the bonding of the first pad portion and the second pad portion, the TiN layers are bonded together in the nitrogen atmosphere, so that the airtight cavity has a nitrogen atmosphere.

9. The method for manufacturing a semiconductor device according to claim 1, the method further comprising:
arranging a spacer to at least one of the one surface of the first substrate and the one surface of the second substrate before the first pad portion and the second pad portion are bonded together; and
in the bonding of the first pad portion and the second pad portion together, setting spacing between the one surface of the first substrate and the one surface of the second substrate equal to or more than a height of the spacer.

10. A semiconductor device comprising:
a first substrate that has one surface;
a second substrate that has one surface and is bonded to the first substrate such that the one surface of the second substrate faces the one surface of the first substrate;
a sensing part that is arranged between the first substrate and the second substrate;
a first pad portion that is arranged on the one surface of the first substrate and is electrically connected to the sensing part; and
a second pad portion that is arranged on the one surface of the second substrate and is electrically connected to the first pad portion,
wherein the first pad portion and the second pad portion respectively have a surface layer including Ti, and the surface layer including Ti of the first pad portion and the surface layer including Ti of the second pad portion are bonded together,
wherein the sensing part includes a structure extending from the first substrate and suspended in air between the first substrate and the second substrate.

11. The semiconductor device according to claim 10, further comprising:
a first sealing portion on the one surface of the first substrate in a frame shape surrounding the first pad portion, and having a surface layer including Ti; and
a second sealing portion on the one surface of the second substrate in a shape surrounding the second pad and corresponding to the frame shape of the first sealing portion, and having a surface layer including Ti, wherein:
the layer including Ti of the first sealing portion and the layer including Ti of the second sealing portion are bonded together; and
the sensing part is encapsulated in an airtight cavity arranged between the first substrate and the second substrate by the first sealing portion and the second sealing portion being bonded together.

12. The semiconductor device according to claim 11, further comprising:
a gettering layer that adsorbs active gas in a portion arranged inside the airtight cavity of at least one of the first substrate and the second substrate.

13. The semiconductor device according to claim 12, wherein the gettering layer has a laminated structure including
a foundation layer with a roughened surface, and
a Ti layer stacked on the roughened foundation layer.

14. The semiconductor device according to claim 12, wherein:
a trench is arranged in a portion where the gettering layer is to be arranged; and
the gettering layer is arranged along a wall surface of the trench so as to have a space inside the trench.

15. The semiconductor device according to claim 11, wherein:
the first pad portion, the second pad portion, the first sealing portion, and the second sealing portion respectively have a TiN layer as a surface layer; the TiN layer is bonded to the adjacent TiN layer; and
the airtight cavity has a nitrogen atmosphere.

16. The semiconductor device according to claim 10, wherein:
a spacer is arranged between the first substrate and the second substrate; and
the spacing between the one surface of the first substrate and the one surface of the second substrate is set to be equal to or larger than a height of the spacer.

* * * * *